United States Patent
Ying et al.

(10) Patent No.: US 11,869,801 B2
(45) Date of Patent: Jan. 9, 2024

(54) SEMICONDUCTOR MANUFACTURING METHOD

(71) Applicant: Changxin Memory Technologies, Inc., Anhui (CN)

(72) Inventors: Zhan Ying, Hefei (CN); Qiang Zhang, Hefei (CN); Yiming Zhu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 90 days.

(21) Appl. No.: 17/408,256

(22) Filed: Aug. 20, 2021

(65) Prior Publication Data
US 2021/0384067 A1  Dec. 9, 2021

Related U.S. Application Data (63) Continuation of application No. PCT/CN2021/083131, filed on Mar. 26, 2021.

(30) Foreign Application Priority Data

May 20, 2020  (CN) .......................... 202010428539.2

(51) Int. Cl.
*H01L 29/00* (2006.01)
*H01L 21/762* (2006.01)
*H01L 29/06* (2006.01)

(52) U.S. Cl.
CPC .... *H01L 21/76229* (2013.01); *H01L 29/0649* (2013.01)

(58) Field of Classification Search
CPC ........... H01L 21/76229; H01L 29/0649; H01L 21/3083; H01L 21/76224; H10B 12/01
(Continued)

(56) References Cited

U.S. PATENT DOCUMENTS

| 7,564,084 B2 | 7/2009 | Song et al. |
| 9,337,101 B1 | 5/2016 | Sung et al. |

(Continued)

FOREIGN PATENT DOCUMENTS

| CN | 1983601 A | 6/2007 |
| CN | 101577242 A | 11/2009 |

(Continued)

OTHER PUBLICATIONS

Extended European Search Report dated Jul. 13, 2022, issued in related European Application No. 21785747.3 (8 pages).
(Continued)

*Primary Examiner* — Theresa T Doan
(74) *Attorney, Agent, or Firm* — Sheppard Mullin Richter & Hampton LLP (57) ABSTRACT

The present invention provides a semiconductor manufacturing method. A substrate having a plurality of first trenches can be provided. The substrate can include a first pattern formed between two adjacent first trenches. A first dielectric layer can be deposited onto the substrate. The first dielectric layer can cover at least one side wall of the first pattern. A second dielectric layer can be deposited onto the substrate. The second dielectric layer can fill the first trenches. The first pattern can be severed to form a second pattern on the substrate. The second dielectric layer can be removed from the first trenches.

20 Claims, 5 Drawing Sheets

(58) Field of Classification Search
USPC .......................................... 257/520; 438/427
See application file for complete search history.

(56) References Cited

U.S. PATENT DOCUMENTS

| | | | |
|---|---|---|---|
| 9,842,931 B1 * | 12/2017 | Anderson | ............ H01L 21/0337 |
| 10,559,568 B1 | 2/2020 | Huang | |
| 10,861,740 B2 | 12/2020 | Wang et al. | |
| 2003/0017671 A1 | 1/2003 | Lee et al. | |
| 2012/0119289 A1 | 5/2012 | Kim | |
| 2012/0126374 A1 | 5/2012 | Carollo et al. | |
| 2015/0108601 A1 | 4/2015 | Kwon | |
| 2016/0163543 A1 | 6/2016 | Kim et al. | |
| 2017/0287907 A1 | 10/2017 | Apodaca et al. | |
| 2018/0006111 A1 | 1/2018 | Xie et al. | |
| 2020/0091311 A1 | 3/2020 | Hsu et al. | |

FOREIGN PATENT DOCUMENTS

| | | |
|---|---|---|
| CN | 104051346 A | 9/2014 |
| CN | 107230702 A | 10/2017 |
| CN | 107275286 A | 10/2017 |
| CN | 108807282 A | 11/2018 |
| CN | 112447582 A | 3/2021 |
| EP | 3944301 A1 | 1/2022 |
| WO | 2021/232936 A1 | 11/2021 |

OTHER PUBLICATIONS

PCT International Search Report and the Written Opinion dated Jun. 30, 2021, issued in related International Application No. PCT/CN2021/083119, with English translation (13 pages).
PCT International Preliminary Report on Patentability dated Dec. 1, 2022, issued in related International Application No. PCT/CN2021/083119, with English translation (9 pages).
PCT International Search Report and the Written Opinion dated Jun. 9, 2021, issued in related International Application No. PCT/CN2021/083131, with English translation (8 pages).
PCT International Preliminary Report on Patentability dated Dec. 1, 2022, issued in related International Application No. PCT/CN2021/083131, with English translation (9 pages).
Extended European Search Report dated Jul. 15, 2022, issued in related European Patent Application No. 21785736.6 (10 pages).
Examination Report dated Mar. 14, 2023, issued in related European Application No. 21785747.3 (5 pages).
Non-Final Office Action dated Oct. 30, 2023, issued in related U.S. Appl. No. 17/431,148 (22 pages).

* cited by examiner

SEMICONDUCTOR MANUFACTURING METHOD

CROSS-REFERENCE TO RELATED APPLICATIONS

This application is a continuation application of International Patent Application No.: PCT/CN2021/083131, filed on Mar. 26, 2021, which claims priority to Chinese Patent Application No.: 202010428539.2, filed on May 20, 2020. The above-referenced applications are incorporated herein by reference in their entirety.

TECHNICAL FIELD

The present application relates to the field of semiconductor technologies. In particular, the present invention relates to a semiconductor manufacturing method.

BACKGROUND

A dynamic random access memory (DRAM) is a semiconductor memory widely used in computing systems. As semiconductor integrated circuit technology continues to advance, the feature size of the dynamic random access memory becomes smaller and smaller. For example, the size of the active area of a memory becomes smaller as integrated circuit technology evolves. As such, the ever shrinking of integrated circuits has very high requirement on semiconductor manufacturing processes. When the width of the active area of an integrated circuit becomes very small, existing etching process used to fabricate the active area may damage the ends of the active area.

SUMMARY

A semiconductor manufacturing method provided herein solves the problem of ends of an active area being damaged during an etching process. In various embodiments, the semiconductor manufacturing method comprises providing a substrate having first trenches. The substrate can include a first pattern formed between the first trenches. A first dielectric layer can be deposited onto the substrate. The first dielectric layer can cover at least one side wall of the first pattern. A second dielectric layer can be deposited onto the substrate. The second dielectric layer can fill the first trenches. The first pattern can be severed to form a second pattern on the substrate. The second dielectric layer can be removed from the first trenches.

According to some embodiments, the first dielectric layer is deposited onto the at least one side wall of the first pattern as a protective layer. When the second pattern is formed by etching the first pattern, because the side wall of the first pattern is protected by the first dielectric layer, the ends of active areas of the substrate including the second pattern are not damaged during the etching process.

DETAILED DESCRIPTION OF THE EMBODIMENTS

To better understand the objectives, technical solutions, and technical effects of the present invention, the following disclosure describes the present invention with reference to drawings and various embodiments. Further, various embodiments described herein are merely used to illustrate the present invention, and not to limit the present invention.

Unless stated otherwise, all technical and scientific terms used herein have the same meanings as those commonly understood by a person skilled in the art. Terms used herein are merely intended to describe specific embodiments, and not intended to limit the present application. The term "and/or" used herein includes any and all combinations of one or more related listed items. In the case of using "include", "have", and "comprise" described herein, another component or method can further be added unless explicit qualifiers, such as "only" and "consist of", are used. Unless stated to the contrary, terms in the singular forms can include the plural forms and cannot be construed to mean a quantity of one.

In conventional semiconductor processes, dry etching is performed on a substrate through a one-step etching process to form shallow trenches on the substrate, so that a plurality of active areas can be separated on the substrate. Insulating material layers are then filled into cavities of the shallow trenches to form a trench isolation structure. As the size of a semiconductor structure decreases, ends of active areas can be more elongated. In general, etching gas used in a dry etching process can contain high number of high-energy charged particles. As the substrate is bombarded with the high-energy charged particles to form the shallow trenches, the ends of the active areas can be damaged or destroyed, thereby causing adverse impact to performance of the active areas (i.e., integrated circuits) etched onto the substrate.

Disclosure provided herein provides solutions to the problems described above. A semiconductor manufacturing method is provided herein. This method can reduce damage to ends of an active area during an etching process.

Figure 1:
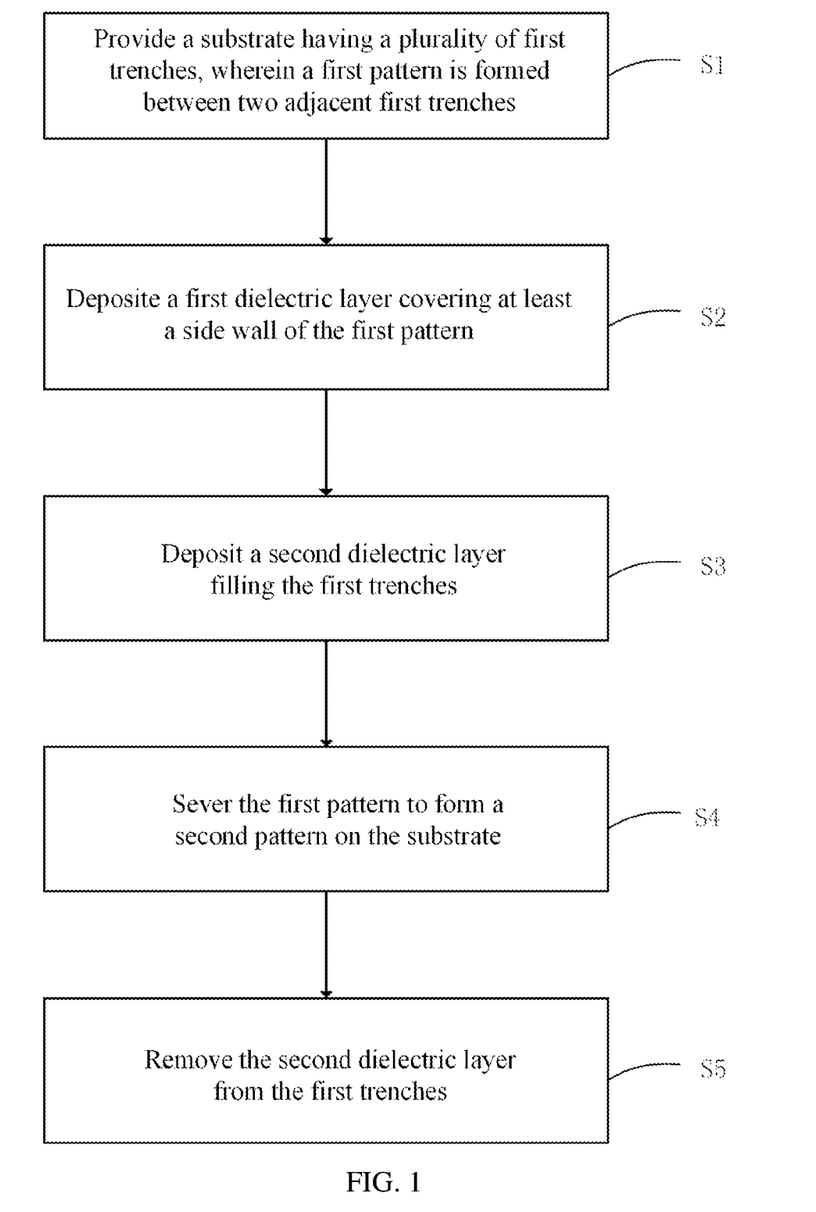
FIG. 1 illustrates a flowchart of a semiconductor manufacturing method according to various embodiments of the present invention.

FIG. 1 illustrates a flowchart of a semiconductor manufacturing method according to various embodiments of the present invention. As shown in FIG. 1, the semiconductor manufacturing method includes the following steps:

At Step S1, a substrate having a plurality of first trenches is provided. The substrate includes a first pattern formed between two adjacent first trenches.

At Step S2, a first dielectric layer is formed or deposited onto the substrate. The first dielectric layer covers at least one side wall of the first pattern.

At Step S3, a second dielectric layer is formed or deposited onto the substrate. The second dielectric layer fills the first trenches.

At Step S4, the first pattern is severed or etched to form a second pattern on the substrate.

At Step S5, the second dielectric layer is removed from the first trenches.

According to the semiconductor manufacturing method of the present invention, the first dielectric layer is formed on the at least one side wall of the first pattern in the substrate as a protective layer. The first pattern is etched to form the second pattern constituting active areas. As such, when the first pattern is etched to form the second pattern constituting the active areas, because the at least one side wall of the first pattern is protected by the first dielectric layer, ends of the second pattern (i.e., ends of the active areas) formed by etching can be better protected in etching processes.

Figure 2:
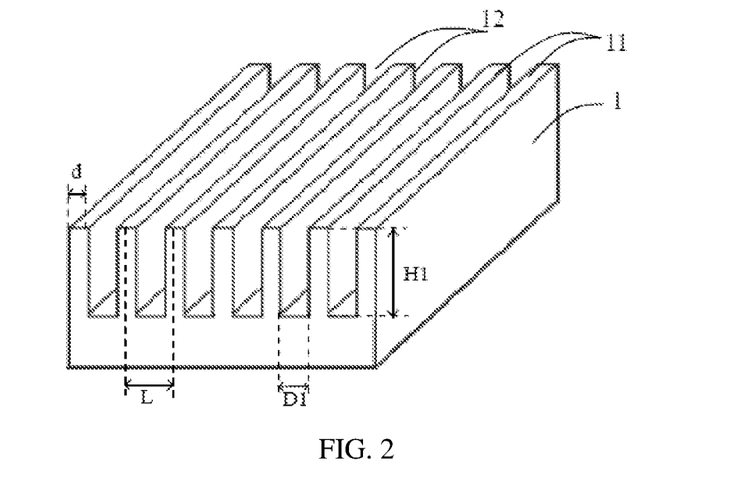
FIG. 2 illustrates a three-dimensional structural diagram of a substrate having first trenches according to various embodiments of the present invention.

FIG. 2 illustrates a three-dimensional structural diagram of a substrate 1 having first trenches 12 according to various embodiments of the present invention. The substrate 1 is initially etched to form the first trenches 12. This initial etching process can result in forming a first pattern 11 on the substrate 1 between the first trenches 12. In various embodiments, the substrate 1 can be, but is not limited to, a silicon substrate, a gallium nitride substrate, a silicon-on-insulator, a silicon carbide substrate, or the like. In one embodiment, the substrate 1 can be a silicon substrate. According to some embodiments, the substrate 1 can be doped with various atomic particles (e.g., ions), through an ion implantation process, to form doped well regions. A doped well region on the substate 1 can either be P-type or N-type.

According to some embodiments, as shown in FIG. 2, the first pattern 11 and the first trenches 12 can constitute a strip-shaped array structure. The first pattern 11 can be plate-shaped wall structures. For example, according to some embodiments, the first pattern 11 can be, but are not limited to, rectangular plate-shaped wall structures. According to some embodiments, the first pattern 11 can be spaced apart in an array by the first trenches 12 formed between two adjacent first pattern 11. Specifically, the first pattern 11 is parallelly spaced in the array.

According to some embodiments, as shown in FIG. 2, a width d of the first pattern 11 can be set based on needs. According to some embodiments, the width d can be a length of a cross section perpendicular to an extension direction of the first pattern 11 in a horizontal direction of the substrate 1. According to some embodiments, the width d of the first patterns 11 can be less than or equal to 20 nm. According to some embodiments, the width d of the first pattern 11 can be at least one of 20 nm, 15 nm, or 10 nm. Within this width range, the technical problem described in the present invention can be more pronounced, and the technical solutions described herein can have better economical and beneficial technical effects.

According to some embodiments, as shown in FIG. 2, a distance L between adjacent first patterns 11 can be set based on needs. According to some embodiments, the distance L between adjacent first patterns 11 can be less than or equal to 30 nm. According to some embodiments, the distance L between adjacent first patterns 11 can be at least one of 30 nm, 25 nm, 20 nm, 15 nm, or 10 nm. In general, the distance L between adjacent first patterns 11 is not limited to the above distances. It should be noted that, for the distance L between adjacent first patterns 11 being of less than or equal to 30 nm, this distance is referred to as a center-to-center distance between two adjacent first patterns 11.

According to some embodiments, a self-aligned double patterning (SADP) process or a self-aligned quadruple patterning (SAQP) process can be used to form the strip-shaped array structure on the substrate 1 including the first pattern 11 and the first trenches 12. The SADP process and the SAQP process are known to a person skilled in the art and are not described in detail herein.

Figure 3:
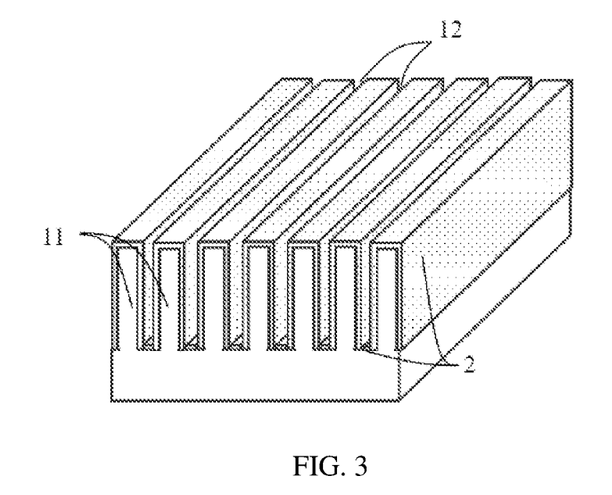
FIG. 3 illustrates a three-dimensional structural diagram of a substrate having first trenches and a first dielectric layer deposited onto the substrate according to various embodiments of the present invention.

FIG. 3 illustrates a three-dimensional structural diagram of a substrate 1 having first trenches 12 and a first dielectric layer 2 deposited onto the substrate 1 according to various embodiments of the present invention. As shown in FIG. 3, the substrate 1 can include the first dielectric layer 2 deposited onto side surfaces and bottom surfaces of the first trenches 12. The first dielectric layer 2 can serve as a protective layer during etching processes. According to some embodiments, the first dielectric layer 2 can be deposited on the side surfaces of the first trenches 12, the bottom surfaces of the first trenches 12, and top surfaces of the first pattern 11. In this way, the first dielectric layer 2 can effectively protect the first pattern 11 from subsequent etching processes.

According to some embodiments, a thicknesses of the first dielectric layer 2 can be determined based on needs. According to some embodiments, the thicknesses of the first dielectric layer 2 can be less than half of a width of the first trenches 12 (i.e., a width D1 of FIG. 2). In such embodiments, there can still be gaps within the first trenches 12 after the first dielectric layer 2 is deposited (i.e., the first dielectric layer 2 has not completely filled the cavities of the first trenches 12). According to some embodiments, the thickness of the first dielectric layer 2 can range from 1 nm to 5 nm. In such embodiments, the first dielectric layer 2 not only can provide protection for the first pattern 11 from etching processes, it can also leave enough space for subsequent filling of dielectric layers.

According to various embodiments, the first dielectric layer 2 can be formed or deposited through a physical vapor deposition process, a chemical vapor deposition process, an atomic layer deposition process, a thermal oxidation process, or the like. According to some embodiments, the first dielectric layer 2 can be, but not limited to, a silicon dioxide ($SiO_2$) layer, a silicon monoxide (SiO) layer, a silicon nitride (SiN) layer, a silicon oxynitride (SiON) layer, or the like. According to some embodiments, the first dielectric layer 2 can be a silicon dioxide layer.

Figure 4:
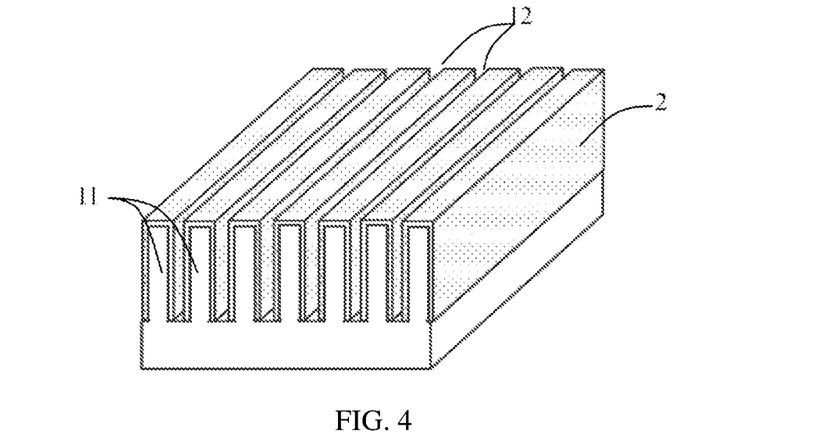
FIG. 4 illustrates a three-dimensional structural diagram of a substrate having first trenches and a first dielectric layer deposited onto the substrate according to various embodiments of the present invention.

FIG. 4 illustrates a three-dimensional structural diagram of a substrate 1 having first trenches 12 and a first dielectric layer 2 deposited onto the substrate 1 according to various embodiments of the present invention. FIG. 4 depicts a scenario in which the first dielectric layer 2 deposited at bottom surfaces of the first trenches 12 are removed prior to depositing a second dielectric layer (e.g., a second dielectric layer 4 of FIG. 5). As such, the bottom surfaces of the first dielectric layer 2 are separated (or removed) from the substrate 1 to form a discontinuous separation structure. In this way, accumulation of charge carriers (e.g., holes and electrons) at the bottom surfaces of the first trenches 12 can be avoided. Therefore, electric leakage caused by the accumulation of charge carriers in the substrate 1 near the first dielectric layer 2 can be avoided. It should be noted that, in various embodiments, all or some of the first dielectric layer 2 at the bottom surfaces of the first trenches 12 can be removed. According to some embodiments, all of the first dielectric layer 2 at the bottom surfaces of the first trenches 12 are removed prior to depositing the second dielectric layer. According to some embodiments, the first dielectric layer 2 deposited at the bottom surfaces of the first trenches 12 can be removed through a dry etching process or the like.

Figure 5:
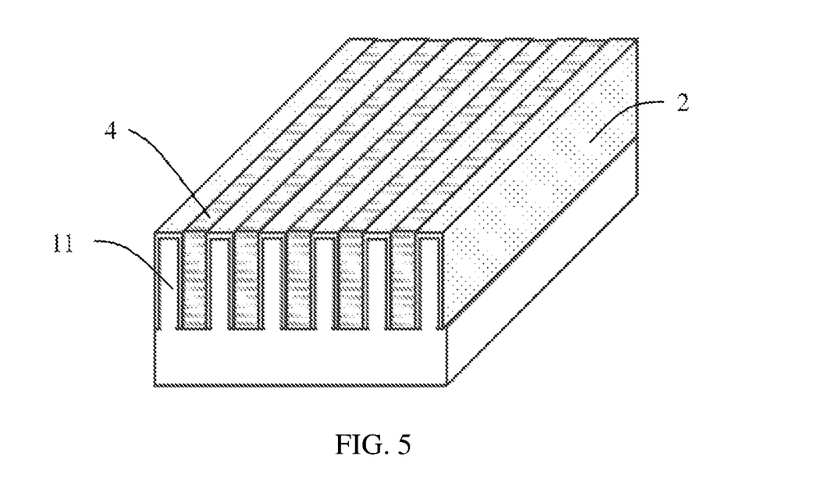
FIG. 5 illustrates a three-dimensional structural diagram of a substrate having first trenches deposited with a first dielectric layer and a second dielectric layer according to various embodiments of the present invention.

FIG. 5 illustrates a three-dimensional structural diagram of a substrate 1 having first trenches 12 deposited with a first dielectric layer 2 and a second dielectric layer 4 according to various embodiments of the present invention. As shown in FIG. 5, according to some embodiments, the second dielectric layer 4 can be deposited within cavities of the first trenches 12 that is already deposited with the first dielectric layer 2. In such embodiments, the second dielectric layer 4 can completely fill the cavities of the first trenches 12.

According to various embodiments, the second dielectric layer 4 can be deposited onto the substrate 1 through a physical vapor deposition process, a chemical vapor deposition process, an atomic layer deposition process, a spin-coating process, or the like. According to some embodiments, a material of the second dielectric layer 4 can be different from a material of the first dielectric layer 2. For example, according to some embodiments, a hardness of the first dielectric layer 2 can be greater than a hardness of the second dielectric layer 4. In this way, the first dielectric layer 2 can provide better protection for the first pattern 11. As another example, a removal rate of the second dielectric layer 4 can be higher than a removal rate of the first dielectric layer 2 under an etching condition. This difference in removal rates ensures that the first dielectric layer 2 deposited on upper surfaces of the first pattern 11 is more resistant to removal in subsequent removal of the second dielectric layer 4. According to some embodiments, the second dielectric layer 4 can be, but not limited to, a spin-on carbon (SOC) layer, a spin-on glass (SOG) layer, or the like. In general, any material layer that meets the above criteria can be used herein.

Figure 6:
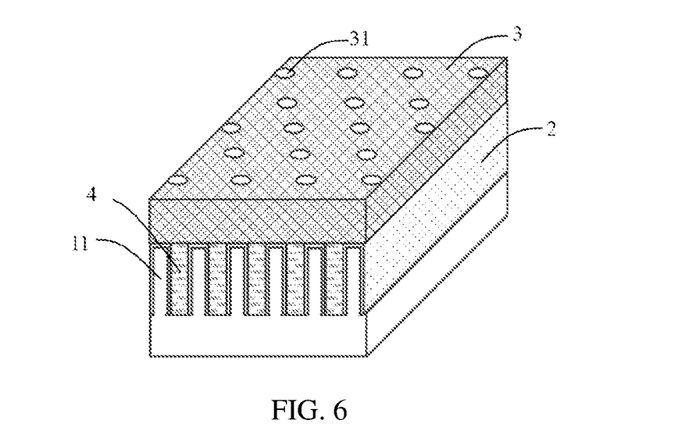
FIG. 6 illustrates a three-dimensional structural diagram of a substrate having first trenches deposited with a first dielectric layer, a second dielectric layer, and a patterned mask layer according to various embodiments of the present invention.

FIG. 6 illustrates a three-dimensional structural diagram of a substrate 1 having first trenches 12 deposited with a first dielectric layer 2, a second dielectric layer 4, and a patterned mask layer 3 according to various embodiments of the present invention. As shown in FIG. 6, the second dielectric layer 4 can be filled (or deposited) into cavities of the first trenches 12 deposited with the first dielectric layer 2. In various embodiments, the second dielectric layer 4 and the first dielectric layer 2 can be deposited onto the substrate 1 through a physical vapor deposition process, a chemical vapor deposition process, an atomic layer deposition process, a spin-coating process, or the like.

According to some embodiments, the second dielectric layer 4 covering the first dielectric layer 2 and deposited onto upper surfaces of the first pattern 11 can be removed while retaining the second dielectric material layer 4 deposited into the cavities of the first trenches 12. For example, the second dielectric layer 4 that cover the first dielectric layer 2 deposited onto the upper surfaces of the first pattern 11 can be removed through a chemical mechanical polishing process or the like. In this example, the second dielectric layer 4 deposited onto the first dielectric layer 2 of the upper surfaces of the first pattern 11 and the second dielectric layer 4 deposited into the cavities of the first trench 12 have a continuous flat surface.

Upon partially removing the second dielectric layer 4 to form the continuous flat surface, as shown in FIG. 6, the patterned mask layer 3 can be deposited onto an upper surface of the substrate 1. According to some embodiments, the patterned mask layer 3 can include a plurality of opening patterns 31 penetrating through the patterned mask layer 3. The plurality of opening patterns 31 can define positions and shapes of second trenches (e.g., second trenches 112 of FIG. 7). In various embodiments, shapes of the opening patterns 31 can be circular, elliptical, rectangular, or the like. The first pattern 11 can be etched based on the opening patterns 31 of the patterned mask layer 3 to form the second trenches 112. In this way, each of the first pattern 11 can be cut or etched into a second pattern (e.g., a second pattern 111 of FIG. 7). Upon etching the first pattern 11 into the second pattern, the patterned mask layer 3 can be removed.

According to various embodiments, the patterned mask layer 3 can be, but is not limited to, an amorphous carbon layer, a silicon oxynitride layer, a silicon oxide layer, or a combination of at least two of the aforementioned layers. According to some embodiments, the patterned mask layer 3 can be deposited onto the substrate 1 through at least one of a physical vapor deposition process, a chemical vapor deposition process, an atomic layer deposition process, a spin-coating process, or the like.

According to some embodiments, the patterned mask layer 3 can be deposited based on a photolithography process. According to some embodiments, a size of the plurality of opening patterns 31 can be greater than the width d of the first pattern 11. For example, according to some embodiments, the size of the plurality of opening patterns 31 can be a size in a width direction of the first pattern 11. In some cases, the size of the plurality of opening patterns 31 can be a maximum size in a horizontal direction of the substrate 1. For instance, according to some embodiments, the width d of the first pattern 11 can be less than or equal to 20 nm, the size of the second trenches 112 can be less than or equal to 15 nm, the thickness of the first dielectric layer 2 can range from 1 nm to 5 nm, and the size of the plurality of opening patterns 31 can be less than 30 nm. In general, allowing the size of the plurality of opening patterns 31 to be greater than the width d of the first pattern 11 can be helpful in increasing a process window and increasing a product yield. In general, the size of the second trenches can be a size in the width direction of the first pattern 11, or in some cases, can be a maximum size in the horizontal direction of the substrate 1. Many variations are possible.

According to some embodiments, the first pattern 11 can be etched based on the patterned mask layer 3 through a dry etching process. According to some embodiments, the second trenches can be separated from the first pattern 11 without separating the first dielectric layer 2 on the side walls of the first pattern 11. For example, the first pattern 11 can be etched to form the second trenches using the plurality of opening patterns 31 and through an etching process with an etching selection ratio greater than 8 between the first pattern 11 and the first dielectric layer 2. The second patterns are formed between the first trenches 12 and the second trenches. In this example, the first dielectric layer 2 on the side walls of the first pattern 11 are not separated during the etching process. An etching process with a high etching selection ratio is used to only separate the first pattern 11 while retaining the first dielectric layer 2. Therefore, shapes of ends of the second pattern can be better ensured, thereby improving performance of active areas. According to some embodiments, the patterned mask layer 3 can be removed from the substrate 1 through an etching process or a chemical mechanical polishing process.

Figure 7:
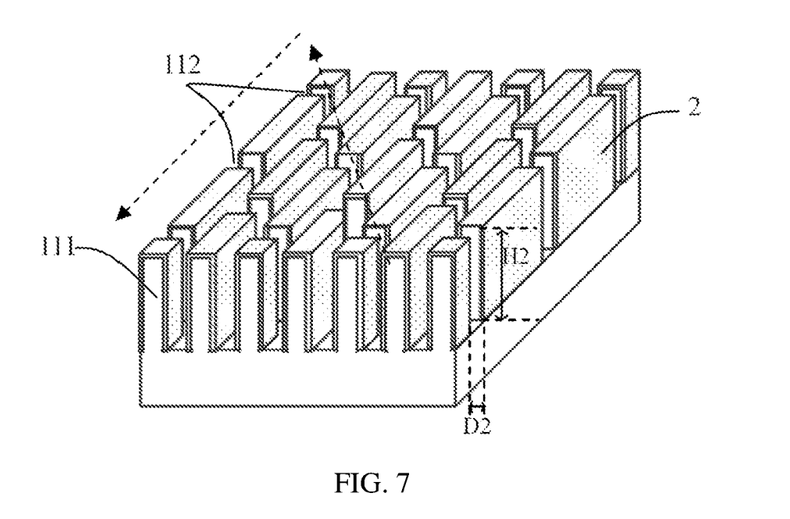
FIG. 7 illustrates a three-dimensional structural diagram of a substrate having first trenches deposited with a first dielectric layer and second trenches etched into a first pattern on the substrate according to various embodiments of the present invention.

FIG. 7 illustrates a three-dimensional structural diagram of a substrate 1 having first trenches 12 deposited with a first dielectric layer 2 and second trenches 112 etched into a first pattern 11 on the substrate 1 according to various embodiments of the present invention. As shown in FIG. 7, according to some embodiments, an extension direction of the first pattern 11 obliquely intersects an arrangement direction of adjacent second trenches 112 spaced apart by a distance in different columns. Specifically, the second trenches 112 on the first pattern 11 are spaced apart, and the second trenches 112 on adjacent first patterns 11 are staggered. For example, the second trenches 112 of the first pattern 11 in odd columns are staggered with the second trenches 112 of the first pattern 11 in even columns. According to some embodiments, the first pattern 11 can be active areas of a storage device, and the above arrangement manner helps maximize a storage density of the storage device.

According to some embodiments, as shown in FIG. 2 and FIG. 7, a depth H1 of the first trenches 12 can be greater than or equal to a depth H2 of the second trenches 112. In such embodiments, the depth H1 of the first trenches 12 can be greater than the depth H2 of the second trenches 112. Allowing the depth H1 of the first trenches 12 to be greater than the depth H2 of the second trenches 112 can achieve a better separation effect and avoid mutual impact between adjacent active areas. According to some embodiments, the depth H1 of the first trenches 12 can be etched differently than the depth H2 of the second trenches 112 by etching the first trenches 12 first and etching the second trenches 112 second through any of the aforementioned etching processes, that is, by etching the substrate 1 twice.

According to some embodiments, as shown in FIG. 2 and FIG. 7, a width D1 of the first trenches 12 can be less than or equal to a width D2 of the second trenches 112. In such embodiments, the width D1 of the first trenches 12 can be less than the width D2 of the second trenches 112. It should be noted that, the width D2 of the second trenches 112 refers to a size in the extension direction of the first pattern 11.

According to some embodiments, second dielectric layer 4 deposited in cavities of the first trenches 12 can be removed through a wet etching process. For example, the second dielectric layer 4 deposited in the cavities of the first trenches 12 can be removed by using an etchant solution. In this example, the etchant solution does not remove the first dielectric layer 2 deposited onto upper surfaces of the first pattern 11 and the substrate 1.

Figure 8:
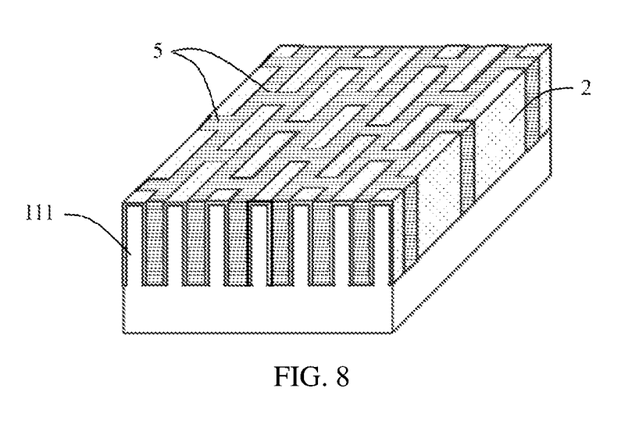
FIG. 8 illustrates a three-dimensional structural diagram of a substrate having first trenches deposited with a first dielectric layer and second trenches etched into a first pattern on the substrate, and cavities of the first trenches and the second trenches are deposited with a third dielectric layer according to various embodiments of the present invention.

FIG. 8 illustrates a three-dimensional structural diagram of a substrate 1 having first trenches 12 deposited with a first dielectric layer 2 and second trenches 112 etched into a first pattern 11 on the substrate 1, and cavities of the first trenches 12 and the second trenches 112 are deposited with a third dielectric layer 5 according to various embodiments of the present invention. According to some embodiments, after a second dielectric layer 4 previously deposited in the cavities of the first trenches 12 is removed, spaces of the first trenches 12 and the second trenches 112 can be filled by the third dielectric layer 5. The third dielectric layer 5 can be filled (deposited) into the cavities of the first trenches 12 and the second trenches 112, and no first dielectric layer 2 exists between the third dielectric layer 5 in the second trenches 112 and the second patterns 111. According to some embodiments, the third dielectric layer 5 in the first trenches 12 is in direct contact with the first dielectric layer 2, and third dielectric layer 5 in the second trenches 112 is in direct contact with the second patterns 111.

According to some embodiments, the third dielectric layer 5 can be deposited on the substrate 1 through a physical vapor deposition process, a chemical vapor deposition process, an atomic layer deposition process, a spin-coating process, or the like. A material of the third dielectric layer 5 can be same as the material of the first dielectric layer 2. In some cases, the material of the third dielectric layer 5 can be different from the material of the first dielectric layer 2. According to some embodiments, the third dielectric layer 5 can be, but are not limited to, a silicon dioxide (SiO2) layer or a silicon nitride (SiN) layer. According to some embodiments, the third dielectric layer 5 and the first dielectric layer 2 can jointly serve as a shallow trench isolation structure.

The manufacturing process of the present invention is simple, has broad application prospects in the field of semiconductor manufacturing, can effectively overcome shortcomings of existing technologies, and has high industrial utilization value.

It should be understood that, although steps in flowcharts are shown in sequence as indicated by the arrows, these steps are not necessarily performed in sequence as indicated by the arrows. Unless expressly stated herein, these steps are not performed in a strict order and can be performed in another order. In addition, at least some of the steps in the flowcharts can include a plurality of steps or stages. These steps or stages are not necessarily performed at the same time, but can be performed at different times, and these steps or stages are not necessarily performed in sequence, but can be performed in turn or alternately with other steps or at least some of steps or stages in other steps.

The technical features in the previously described embodiments can be combined randomly. For simplicity of description, not all possible combinations of the technical features in the previously described embodiments are described. However, the combinations of these technical features should be considered to be within the scope of the present specification as long as they do not contradict each other.

The previously described embodiments represent merely a few embodiments of the present invention with specific and detailed descriptions, but are not construed as a limitation to the scope of the present invention. It should be noted that, variations and modifications that can further be made by a person skilled in the art without departing from the concept of the present invention all fall within the protection scope of the present invention. Therefore, the protection scope of the present invention should be subject to the appended claims.

What is claimed is:

1. A semiconductor manufacturing method, comprising:
    providing a substrate having a plurality of first trenches, wherein a first pattern is formed between two adjacent first trenches;
    depositing a first dielectric layer onto the substrate, the first dielectric layer covering at least one side wall of the first pattern;
    depositing a second dielectric layer onto the substrate, the second dielectric layer filling the first trenches;
    severing the first pattern to form a second pattern on the substrate, wherein severing the first pattern to form the second pattern comprises etching a plurality of second trenches on the first pattern to cut each of the first pattern into the second pattern; and
    removing the second dielectric layer from the first trenches.

2. The semiconductor manufacturing method of claim 1, wherein depositing the first dielectric layer onto the substrate comprises:
depositing the first dielectric layer on the at least one side wall of the first patterns and a bottom surface of the first trenches.

3. The semiconductor manufacturing method of claim 1, wherein depositing the first dielectric layer onto the substrate comprises:
depositing the first dielectric layer on the at least one side wall of the first pattern, a bottom surface of the first trenches, and an upper surface of the first pattern.

4. The semiconductor manufacturing method of claim 3, further comprising:
removing the first dielectric layer deposited at the bottom surface of the first trenches prior to depositing the second dielectric layer onto the substrate.

5. The semiconductor manufacturing method of claim 1, wherein a width of the first pattern is less than or equal to 20 nm.

6. The semiconductor manufacturing method of claim 5, wherein a distance between two adjacent trenches of the first pattern is less than or equal to 30 nm.

7. The semiconductor manufacturing method of claim 1, wherein a hardness of the first dielectric layer is greater than a hardness of the second dielectric layer.

8. The semiconductor manufacturing method of claim 7, wherein the first dielectric layer comprises at least one of a silicon dioxide layer, a silicon monoxide layer, a silicon nitride layer, or a silicon oxynitride layer.

9. The semiconductor manufacturing method of claim 7, wherein the second dielectric layer comprises at least one of a spin-on carbon layer or a spin-on glass layer.

10. The semiconductor manufacturing method of claim 1, further comprising:
depositing a third dielectric layer in the first trenches and the second trenches, wherein the third dielectric layer fills the first trenches and the second trenches and no first dielectric layer is deposited between the third dielectric layer in the second trenches and the second pattern.

11. The semiconductor manufacturing method of claim 10, wherein the third dielectric layer comprises at least one of a silicon dioxide layer, a silicon monoxide layer, a silicon nitride layer, or a silicon oxynitride layer.

12. The semiconductor manufacturing method of claim 1, wherein etching the second trenches on the first pattern to cut each of the first pattern into the second pattern comprises:
depositing a patterned mask layer onto an upper surface of the substrate, wherein the patterned mask layer comprises a plurality of opening patterns penetrating through the patterned mask layer, and the plurality of opening patterns defines positions and shapes of the second trenches; and
etching the first patterns based on the patterned mask layer to cut each of the first pattern into the second pattern.

13. The semiconductor manufacturing method of claim 12, wherein a size of the plurality of opening patterns is greater than a width of the first pattern.

14. The semiconductor manufacturing method of claim 13, wherein a size of the second trenches is less than 15 nm, a thickness of the first dielectric layer ranges from 1 nm to 5 nm, and the size of the plurality of opening patterns is less than 30 nm.

15. The semiconductor manufacturing method of claim 1, wherein an extension direction of the first pattern obliquely intersects an arrangement direction of adjacent second trenches spaced apart by a distance in different columns.

16. The semiconductor manufacturing method of claim 1, wherein a depth of the first trenches is greater than or equal to a depth of the second trenches.

17. The semiconductor manufacturing method of claim 1, wherein a width of the first trenches is less than or equal to a width of the second trenches.

18. The semiconductor manufacturing method of claim 1, wherein the second trenches separate the first pattern without separating the first dielectric layer on the at least one side wall of the first pattern.

19. The semiconductor manufacturing method of claim 18, wherein the first pattern is separated through an etching process with an etching selection ratio greater than 8 between the first pattern and the first dielectric layer.

20. The semiconductor manufacturing method of claim 1, wherein a thicknesses of the first dielectric layer is less than half of a width of the first trenches, and there is a gap between two adjacent first trenches after the first dielectric layer is deposited.

* * * * *